(12) United States Patent
Konrath et al.

(10) Patent No.: US 7,552,529 B2
(45) Date of Patent: Jun. 30, 2009

(54) METHOD FOR ASSEMBLING ELECTRONIC CIRCUITS

(75) Inventors: Willibald Konrath, Cottenweiler (DE); Helmut Greiner, Backnang (DE); Klaus Scholl, Backnang (DE); Werner Horzer, Gomaringen (DE)

(73) Assignee: Ericsson AB, Stockholm (SE)

( * ) Notice: Subject to any disclaimer, the term of this patent is extended or adjusted under 35 U.S.C. 154(b) by 0 days.

(21) Appl. No.: 11/543,170

(22) Filed: Oct. 4, 2006

(65) Prior Publication Data

US 2007/0124927 A1   Jun. 7, 2007

Related U.S. Application Data

(62) Division of application No. 10/498,836, filed as application No. PCT/IB02/05753 on Dec. 13, 2002, now abandoned.

(30) Foreign Application Priority Data

Dec. 18, 2001  (DE) ............................... 101 62 327

(51) Int. Cl.
  *H05K 3/30*  (2006.01)
(52) U.S. Cl. .......................... 29/832; 29/833; 29/33 P; 29/712; 29/740; 198/341.02; 198/341.09; 392/416; 901/47
(58) Field of Classification Search .......... 29/832–834, 29/840, 33 P, 711–712, 720, 739–743; 198/341.02, 198/341.09, 461.2; 414/273; 901/46, 47; 101/129; 392/416

See application file for complete search history.

(56) References Cited

U.S. PATENT DOCUMENTS

| 4,831,724 | A | | 5/1989 | Elliott |
| 5,692,292 | A | | 12/1997 | Asai et al. |
| 6,032,577 | A | * | 3/2000 | Doyle ........................ 101/129 |
| 6,085,408 | A | * | 7/2000 | Watanabe .................... 29/720 |
| 6,170,639 | B1 | * | 1/2001 | Diederich ................ 198/461.2 |
| 6,226,452 | B1 | * | 5/2001 | Hundt et al. ................ 392/416 |
| 6,230,067 | B1 | * | 5/2001 | White ......................... 29/837 |

FOREIGN PATENT DOCUMENTS

WO   WO 01/49094 A1   7/2001

\* cited by examiner

*Primary Examiner*—Donghai D. Nguyen
(74) *Attorney, Agent, or Firm*—Kirschstein, et al.

(57) ABSTRACT

A device for assembling electronic circuits comprises a placing station (7) for placing circuit components on a circuit carrier (1) held at a placing location (17), a fixing station (19) for fixing the circuit components to the circuit carrier (1) under the effect of heat, and a belt conveyor means (9) for conveying a circuit carrier from the placing location (17) to a take-over location (29) of the fixing station (19). The fixing station (19) comprises a heatable zone (22) and a manipulator (21) for raising the circuit carrier (1) from the take-over location (29) and placing it in the heatable zone (22). A continuous belt conveyor (9) of the belt conveyor means extends from the placing location (17) up to the take-over location (29).

10 Claims, 3 Drawing Sheets

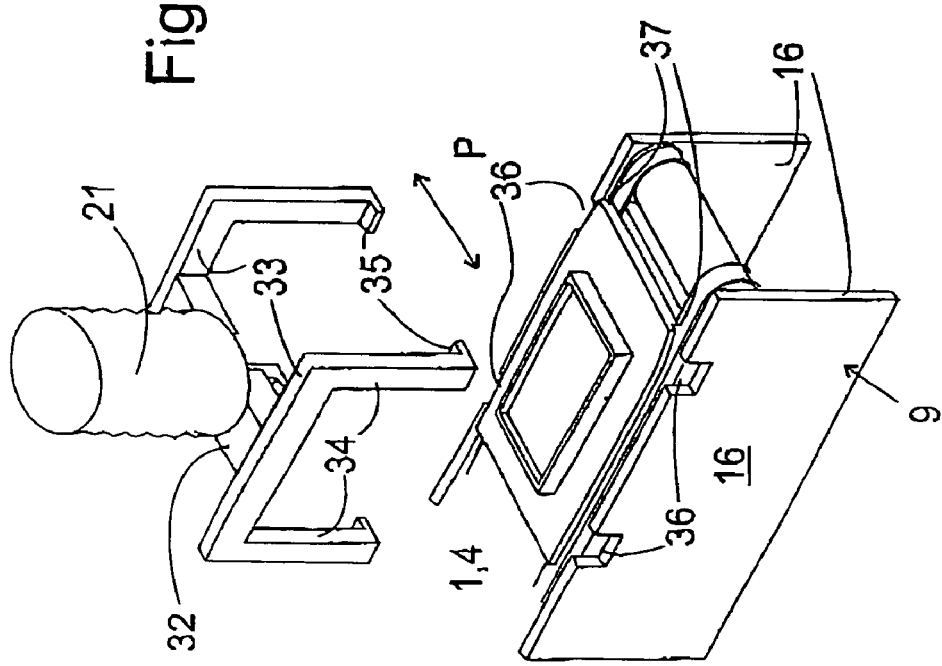
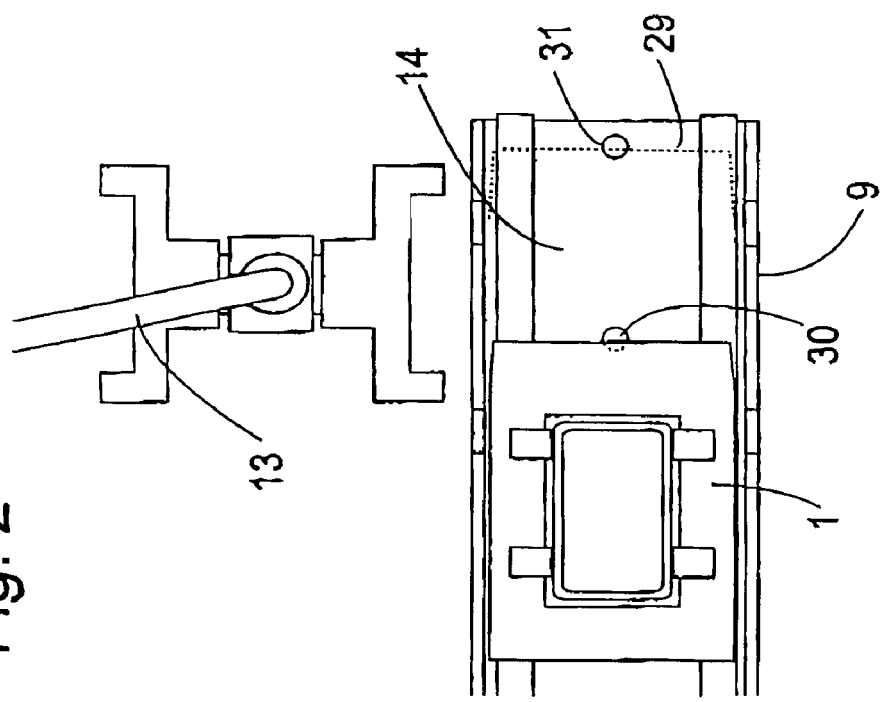

METHOD FOR ASSEMBLING ELECTRONIC CIRCUITS

CROSS REFERENCE TO RELATED APPLICATION

This application is a division of U.S. patent application Ser. No. 10/498,836, filed Nov. 29, 2004, now abandoned, which is a Rule 371 application of International Patent Application No. PCT/IB02/05753, filed Dec. 13, 2002.

BACKGROUND OF THE INVENTION

The present invention relates to an apparatus and a method for automated assembly of electronic circuits.

Usually, for this purpose, program controlled placing devices are used which are capable of taking a circuit component from a stack and inserting it at a given position of a circuit board. When the placing process is finished, the circuit board is heated together with the components placed on it in order to melt solder and to bring the circuit components into contact with conductors of the circuit board.

The process steps of placing and heating are carried out by different devices which, for a completely automated operation, must comprise internal conveyor means which receive a circuit board to be processed at an input of the device, and convey it to a processing location where the circuit board is packed with the components or the components are soldered, respectively, and further to an output of the device. These internal conveying means are often formed with conveyor belts. At a transition from one device to another, these conveyor belts are generally butt jointed, so that a circuit board which is delivered by a conveyor belt of the placing device may slide across the joint onto the conveyor belt of the soldering device and may be further transported by it. Lateral guide rails ensure that the circuit board arrives on the conveyor belt of the soldering device exactly in a correct orientation.

Such a device set-up provides satisfactory results when circuits having working frequencies in the MHz range are assembled. For assembling radio frequency circuits with working frequencies in the GHz range, they have proved unsatisfactory. The reason for this is that, in radio frequency circuits, a much higher positional accuracy is required for the individual circuit components. There are placing devices available which are capable of placing the individual circuit components with the required accuracy onto a circuit board; however, after soldering it is often found that the circuit components are no longer at the intended locations with the required accuracy. An undesirable scatter in the technical properties of the circuit or even circuit failures may result.

SUMMARY OF THE INVENTION

The object of the present invention is to provide an apparatus for assembling electronic circuits which is suitable for manufacturing electronic circuits with well reproducible technical properties, in particular for assembling circuit components on a board with a positioning accuracy in a range of ±50 mm, as required for radio frequency circuits.

The object is achieved by an apparatus having the features of claim 1.

The inventors have found that in current assembling devices an essential reason for the deviations of the soldered circuit components from their intended position is the handover of the circuit board from the conveyor means of the placing device to those of the soldering device. If the conveyor means of these two devices are not exactly parallel, there is an abrupt change of direction at the hand-over of the circuit board which may cause the circuit components to slip. The same applies if the planes in which the conveyor means support the circuit boards have slightly different heights or are not exactly parallel. Also, small differences in the conveying speeds may cause abrupt movements of the circuit board during hand-over.

All these problems are avoided in the apparatus of claim 1 by departing from the conventional conception of automatic devices working autonomously and conveying from the input to the output, and by using, instead, a continuous conveyor belt which bridges the output of the placing device by extending directly from a placing location to take-over location within the fixing device, where a circuit board conveyed on the conveyor belt is taken over by a manipulator in order to place it in a heatable zone of the soldering device.

In order to provide a shock-free transition of a circuit board with components placed on it, it is desirable that each circuit board comes to rest at an exactly reproducible position of the conveyor belt. For this purpose, preferably, a first sensor for detecting a passage of a circuit board is located at the conveyor belt, and a control device connected to this sensor brakes the conveyor belt with a predefined velocity profile after detection of the passage of a circuit board, in order to bring the circuit board to rest at a predefined location.

A second sensor is advantageously located at the conveyor belt at the location where the circuit board should come to rest; it allows for a post-correction of the speed profile in order to compensate inaccuracies of speed control.

According to the first embodiment of the invention, fixing of the circuit components on the circuit board is carried out by soldering. A solder oven employed for this purpose should preferably be evacuable in order to prevent the formation of cavities in the solder layer which might impair the behaviour of radio frequency components.

For reproducible soldering of good quality, it is important that in each solder process the temperature distribution in the solder oven is reproduced as accurately as possible. This may be difficult if the number of circuit boards to be soldered in one solder process varies. In order to achieve a reproducible solder process under these circumstances, too, a parking area for a dummy circuit board is preferably provided in the movement range of the manipulator so that the manipulator may fill the solder oven with the dummy if not all places present in it are occupied by circuit boards.

Another possibility of fixing circuit components on the board is to use a heat-sealing film placed between the board and the circuit components. In order to fix the circuit components on the board using such a film, only a heatable plate is required on which the circuit board having the components placed on it may be put by the manipulator.

In order to protect the highly accurate and susceptible placing station from heat and, possibly, vapours from the solder oven, the placing station is preferably enclosed in a casing having an opening through which the conveyor belt emerges.

If a continuous conveyor belt extends from a pick-up location at the input of the placing station to its output or, as described above, to a take-over location, where a circuit board may be taken over by the manipulator of the fixing station, there is a problem in that a new circuit board without components may not straightforwardly be loaded onto the conveyor belt at the pick-up location as long as a circuit board with components placed on it is still on the conveyor belt. Any vibration during loading might cause a displacement of components on the circuit board equipped with them. Since the circuit board must be conveyed very slowly and carefully between the placing location and the take-over location or, at least, may only be accelerated and braked very slowly, this transport takes considerable time which increases the cycle time of the apparatus. In order to make this cycle time as short as possible, it is proposed to split the conveyor means into two conveyor belts, a first one extending between the pick-up location for the unequipped circuit board and a hand-over location upstream of the placing location and a second conveyor belt extending from the hand-over location via the placing location to the take-over location. Due to this division, it is possible to convey a new, unequipped circuit-board to the hand-over location—which should appropriately be in close proximity to the placing location—before the completely equipped circuit board has reached the take-over location where it is taken over by the manipulator. As soon as it is taken over, the new circuit board only has to be conveyed over a minimum distance on the second conveyor belt to the placing location.

In order to be able to place the circuit components with high accuracy, it is desirable that during the placing procedure the circuit board is not supported by the conveyor means, which might be compliant. For this purpose, preferably an elevating table is provided at the placing location for lifting the circuit board off the conveyor means.

In order to provide a reproducible up and down movement of the elevating table, it is linearly guided by rails. It is difficult to provide absolute parallelism between these rails and the movement of an actuator that drives the up and down movement of the elevating table. In order to prevent abrupt movements from being caused by deviations from parallelism when the elevating table reaches its abutments, a clearance is provided in the connection of the actuator to the elevating table.

The actuator for raising and lowering the elevating table is preferably driven by a pressurized fluid, i.e. hydraulically or pneumatically. The free cross-section of an exhaust line by which pressure fluid is exhausted from the actuator when lowering the elevating table is smaller than the free cross-section of a feed line by which pressurized fluid is fed into the actutator when raising the elevating table. This measure allows for a reduction of the descending speed of the actuator without requiring sophisticated controls, so that while the circuit board equipped with circuit components is being deposited on the conveyor belt, absolutely no vibrations can occur.

Preferably, the cross-section of the exhaust line is reduced only locally by a throttle. The free cross-section of this throttle should be adjustable, so that the speed of the downward movement can be adapted to current requirements by adjusting the cross-section.

BRIEF DESCRIPTION OF THE DRAWINGS

Further features and advantages of the invention become apparent from the subsequent description of embodiments referring to the appended drawings.

FIG. 2 is a detailed view of the take-over location of the device of FIG. 1;

FIG. 3 is a perspective view of the take-over location;

DETAILED DESCRIPTION OF THE PREFERRED EMBODIMENTS

Figure 1:
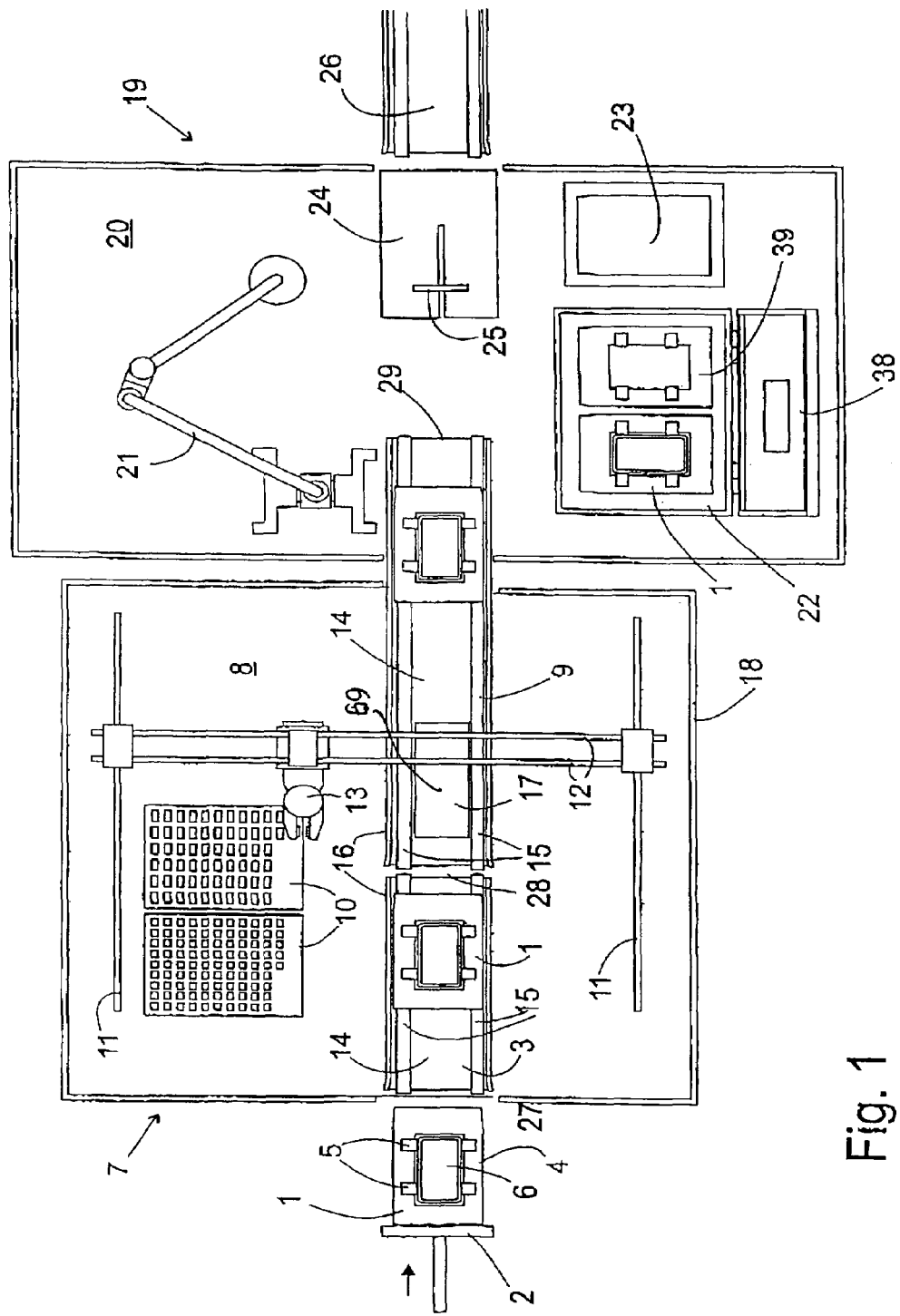
FIG. 1 is a schematic top view of a device for assembling electronic circuits according to the invention.

The assembling device of FIG. 1 is transited by the circuit carrier 1 to be equipped from left to right. The first apparatus of the device is a magazine loader, which, being known as such, is not represented in detail in the drawing. Such a magazine loader comprises a rack which receives a plurality of circuit carriers and is adjustable in height, so that the circuit carriers 1 may successively be placed in front of a slider 2 which pushes them onto a first belt conveyor 3.

The circuit carriers 1 are here formed of a carrier board 4 of metal having a width selected such that it fits with little clearance onto the belt conveyor 3 and which is slightly tapered at its front end in order to ensure that the carrier board can safely be pushed onto the first belt conveyor 3 without risk of tilting. A metal casing 6 in which circuit components are to placed is fixed to the carrier board 4 by several screwed pads 5. Alternatively, the circuit carrier might be formed only of such a casing if it has appropriate dimensions for safe transport on the belt conveyor 3.

The first belt conveyor 3 is part of a computer controlled placing apparatus 7. The placing apparatus 7 comprises a table top 8 on which the first belt conveyor 3, a subsequent second belt conveyor 9 and magazine containers 10 for the circuit components to be placed in the casing 6 of circuit carrier 1 are located. Above the table top 8, a gripper arm 13 is mounted to a granite board (not shown) displaceably in vertical and, by means of rails 11, 12, in two horizontal directions. The two belt conveyors 3, 9 are essentially similar in construction. Both comprise a base plate 14 around which two conveyor belts 15 are wound and are driven by a motor. The base plate is delimited at its longitudinal sides by side plates 16 that-define a transport path for the circuit carrier 1 and that are slightly divergent at their upstream end in order to provide a safe transition of the circuit carriers 1.

The second belt conveyor 9 differs from the first 3 essentially in that in its upstream portion an elevating, table 17 is inserted into the base plate 14, and that its length is considerably greater than that of the first belt conveyor 3, so that it extends out of the casing 18 of the placing device and into a subsequent soldering device 19. The section of the second belt conveyor extending into the soldering device will subsequently be further described with reference to FIGS. 2 and 3.

The soldering device 19 comprises, mounted to a table top 20, a manipulator formed by a highly precise and vibration-free robot arm 21, an evacuable solder oven 22, a support 23 for a circuit carrier dummy and a cooling-off plate 24 formed by a metal plate having cooling water ducts arranged inside it and a slider for pushing a circuit carrier cooled-off on the cooling plate 24 out of the soldering device 19 to a further belt conveyor 26.

The operation of the illustrated device is as follows. At the pickup location 27, at the beginning of the first belt conveyor 3, a circuit carrier 1 is pushed onto the first belt conveyor 3 using slider 2. The first belt conveyor 3 conveys the circuit carrier 1 to a hand-over location 28 for hand-over to the second belt conveyor 9. At this hand-over location 28, the two belt conveyors 3, 9 are butt-jointed, and the occurrence of vibrations during hand-over of the circuit carrier 1 cannot be completely avoided, but is harmless since there are no circuit components placed on it yet.

The second belt conveyor 9 has conveyor belts 15 which, at that time, circulate with essentially the same speed as the conveyor belts 15 of the first belt conveyor 3. They convey the circuit carrier 1 further and come to rest at a placing location 69, at which the circuit carrier is immediately above the elevating table 17. By raising the elevating table 17, the circuit carrier 1 loses contact with the conveyor belts 15 and, instead, has its planar bottom side stably resting on the elevating table 17. In this way, it is made sure that during the placing procedure, the circuit carrier 1 cannot be displaced by pressure exercised by gripper arm 13, so that the complete placing procedure can be carried out at a high accuracy.

During the placing process, there is no further circuit carrier 1 on the second belt conveyor 9; however, a further circuit carrier from the magazine loader may have already arrived on the first belt conveyor 3.

When the placing procedure is finished, the elevating table 17 is descended again, so that the circuit carrier 1 located on it is again deposited on the conveyor belts 15 of second belt conveyor 9 carefully and without vibrations.

From this position, the circuit carrier 1 equipped with the circuit components is further conveyed by the second belt conveyor 9, the acceleration of the circuit carrier being selected low enough to prevent vibrations and slipping of the placed circuit components.

Before reaching a take-over location 29 at the end of the second belt conveyor 9, a gentle deceleration of the circuit carrier 1 begins. For this purpose, as can be seen in the top view of FIG. 2, a first sensor 30, e.g. a photo detector, is inserted into the base plate 14 of the second belt conveyor 9 in order to detect the passage of the leading edge of a circuit carrier 1 at a distance from its intended rest position at the take-over location 29, which is sufficient to bring the circuit carrier to rest without causing vibrations. As soon as the passage of the circuit carrier is detected at the first sensor 30, it is e.g. begun to brake the belt conveyor 9 with a constant deceleration, which is selected such that, provided that the control is free from tolerances and errors, the circuit carrier will come to rest exactly at the take-over location, as indicated by a dashed outline of the leading edge of the circuit carrier in FIG. 2.

In order to bring the circuit carrier 1 to rest exactly at this predefined position 29, the second belt conveyor 9 is preferably further equipped with a second sensor 31 that extends over approximately 1 to 2 mm in transport direction and provides an output signal proportional to its degree of coverage by the circuit carrier. Based on this output signal, a control (not shown) of the belt conveyor 9 is capable of detecting whether the circuit carrier reaches the second sensor 31 before or after an expected instant, and whether, in consequence, the braking procedure must be shortened or prolonged in order to reach the desired target position 29.

FIG. 3 shows a perspective view of the second belt conveyor 9 having a circuit carrier 1 placed at the takeover location, and, above, an end effector 32 of robot arm 21. The end effector 32 comprises two claws 33 that are moveable transversely to the transport direction in the direction of arrow P, each having two downward projecting fingers 34, that have inwardly directed tips 35 at the ends. In the side wings 16 of the second belt conveyor 9, two cutouts 36 adapted to the size and distance of the fingers 34 are formed, which allow the tips 35 to engage longitudinal recesses 37 at the bottom of carrier plate 4 of the circuit carrier 1 and thus, to lift it safely.

The robot arm 21 afterwards places the circuit carrier in the solder oven 22. The oven shown has two locations for circuit carriers, but might also be larger or smaller. FIG. 1 shows the solder oven 22 with an open lid 38, a circuit carrier 1 placed inside the oven 22 and a dummy circuit carrier 39 placed next to it. This dummy 39 is placed in the oven 22 if a solder process is to be carried out on a single circuit carrier 1. Its thermal properties are practically the same as of an equipped circuit carrier, so that the temperature distribution in the solder oven 22 is the same in each solder process, regardless of how many locations of the solder oven are occupied by circuit carriers or by dummies.

After loading the solder oven 22, the lid 38 is closed; the solder process is carried out in a conventional manner under vacuum.

When the solder process is finished, the lid 38 is opened, and the robot arm 21 extracts the soldered circuit carrier or carriers and places them on the water cooled cooling plate 24. After cooling off, the slider 25 is operated, and the soldered and cooled circuit carriers 1 are pushed out onto the belt carrier 26.

Figure 4:
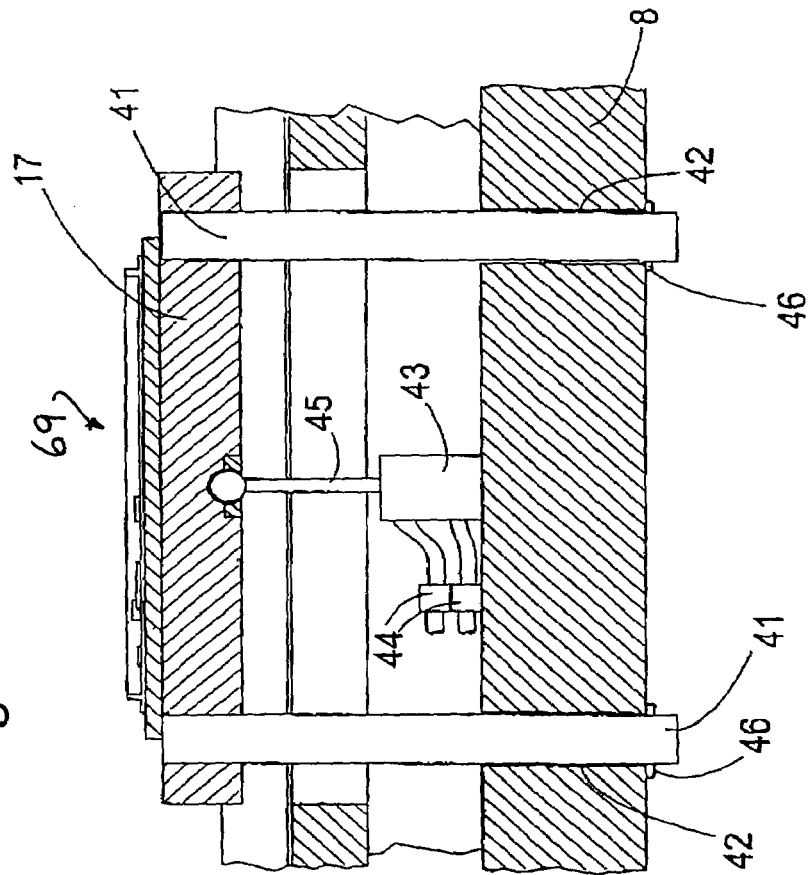
FIG. 4 is a schematic section of the placing location of the device of FIG. 1.

FIG. 4 shows a schematic longitudinal section through the placing location and the elevating table 17. The elevating table 17 is a solid metal plate having two through bores in which cylindrical columns 41 are fixedly inserted. The columns 41 are exactly parallel to each other and extend with minimum clearance through bores 42 of table top 8. The elevating table 17 is vertically displaceable by means of a pneumatic actuator 43 having a double acting piston and a piston rod 45. Switching valves 44 that control ingress and egress of air into/from the two chambers of actuator 43 are located on the table top 8 at a minimum distance from actuator 43, in order to minimize pressure vibrations in the chambers which might provoke an uneven movement of the elevating table 17.

Since the columns 41 must be guided with minimum clearance in the bores 42, a horizontal component of the acting force of actuator 43 may cause the elevating table 17 to jam during up and down movement if the piston rod 45 is not exactly parallel to the columns 41. This must be avoided. For this purpose, the head of the piston rod 45 is received with a clearance in a recess of plate 17. In the Figure this head is shown as a sphere engaging a similarly spherical recess; the required clearance may also simply be achieved by a threaded head of the piston rod 45 engaging a threaded bore of elevating table 17 without being fastened to it.

The range of movement of the elevating table 17 is limited in upward direction by projections (here formed by rings 46) at the lower ends of columns 41, which, in a completely raised position of the elevating table 17 abut against the bottom side of table top 8. This construction allows to fix the elevating table 17 in the raised position shown in the Figure without having to squeeze any parts, by merely providing pressure in one of the chambers of actuator 43. This pressure is selected such that a pressing force exerted from above by the gripper arm 13 when placing a circuit component is not sufficient to override the supporting force of the piston rod 45.

Figure 5:
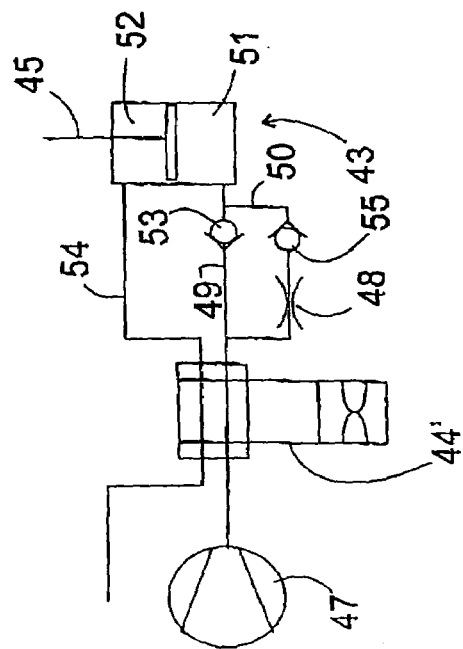
FIG. 5 is a schematic representation of the pneumatic layout of the placing location.

FIG. 5 schematically shows the pneumatic layout of the placing location according to a preferred embodiment. The switching valves are here combined into a single valve 44' having two inputs, two outputs and three switching positions. In a first switching position, the valve 44' connects a pressure fluid source, e.g. a compressor, to a lower chamber 51 of the cylinder of the double-acting actuator 43 by a feed line 49. A check valve 53 in the feed line 49 ensures that pressurized air can only flow through the feed line 49 in a direction from the valve 44' to the lower chamber 51.

Air entering the lower chamber 51 urges the piston of the cylinder upward, so that the elevating table 17 mounted to the piston rod 45 is raised. Air from the upper chamber 52 is exhausted by a line 45 that goes through valve 44'.

When the elevating table 17 has reached a desired level, the valve 44' is switched over into a second position in which the connections between its inputs and outputs are all interrupted. The air thus enclosed in the chambers 51, 52 of the actuator 43 opposes any vertical displacement of the elevating table 17. In such a raised state, a circuit carrier on the elevating table 17 may have circuit components placed on it.

When after placing the circuit components the elevating table 17 is to be descended again, the valve 44' is switched to a third position in which the inputs and outputs are cross-coupled with respect to the first switching position. Thus, now the upper chamber 52 is provided with pressurized air from compressor 47 by line 54, and air from the lower chamber 51 escapes by an exhaust line 50 by-passing feed line 49. The exhaust line 50 has a check valve 55 arranged opposite to the check valve 53, and a throttle 48 having a controllable free cross-section. The throttle 48 considerably reduces the free cross-section of the exhaust line 50 in comparison with the feed line 49 and the line 53. The throttle 48 thus causes the air to escape from the lower chamber 51 during the downward movement of the piston much more slowly than from the upper chamber 52 in case of an upward movement. In a simple way, this arrangement allows a fast upward movement of the circuit carrier 1 which is desirable in view of short cycle times, and a slow downward movement which is required in order to avoid vibrations when the circuit carrier settles on the belt conveyor 9. The speed of the downward movement can be set by controlling the cross-section of throttle 48.

As an alternative to the design shown in FIG. 5, one-way feed and output lines might also be assigned to the upper chamber 52. In that case, a throttle for braking the downward movement would have to be placed in the feed line.

What is claimed:

1. A method of assembling an electronic circuit on a circuit carrier, comprising the following cyclically repeated steps:
   a) placing components on the circuit carrier at a placing location, and subsequently conveying the circuit carrier equipped with circuit components from the placing location to a take-over location using one belt conveyor;
   b) concurrently with step a), conveying an unequipped circuit carrier between a pickup location and a hand-over location using another belt conveyor;
   c) handing over the unequipped circuit carrier to the one belt conveyor and conveying the unequipped circuit carrier to the placing location;
   d) taking over the equipped circuit carrier at the take-over location and placing the equipped circuit carrier in a solder oven using a manipulator;
   e) dimensioning the solder oven to receive a plurality of circuit carriers; and
   f) providing the manipulator with a range of movement between a support for a dummy circuit carrier and at least one placing location for the dummy circuit carrier.

2. The method of assembling the electronic circuit according to claim 1, in that the handing over step of the unequipped circuit carrier to the one belt conveyor is carried out after the taking over step of the equipped circuit carrier is performed.

3. The method of assembling the electronic circuit according to claim 1, and a step of detecting the conveying of the circuit carrier arranged at the one belt conveyor with a first sensor, and braking the one belt conveyor after detection of the conveying of the circuit carrier by the first sensor.

4. The method of assembling the electronic circuit according to claim 3, and a step of detecting the circuit carrier placed at the one belt conveyor with a second sensor downstream of the first sensor, and a step of bringing the one belt conveyor to rest at the moment when the circuit carrier is detected by the second sensor.

5. The method of assembling the electronic circuit according to claim 1, wherein the placing station is enclosed within a casing, and wherein the one belt conveyor extends outwardly through an opening of the casing.

6. The method of assembling the electronic circuit according to claim 5, and a step of lifting the circuit carrier off the one belt conveyor at the placing location with an elevating table.

7. The method of assembling the electronic circuit according to claim 6, and a step of vertically linearly guiding the elevating table, and the step of raising and lowering the elevating table with an actuator being connected with a clearance to the elevating table.

8. The method of assembling the electronic circuit according to claim 6, and a step of raising and lowering the elevating table with an actuator driven by a pressurized fluid, and a throttle associated with the actuator in order to be transited by the pressurized fluid when lowering the elevating table.

9. The method of assembling the electronic circuit according to claim 8, and a step of adjusting a free cross-section of the throttle.

10. The method of assembling the electronic circuit according to claim 6, and a step of raising and lowering the elevating table with a double-acting actuator.

* * * * *